United States Patent
Preux et al.

(10) Patent No.: US 11,136,863 B2
(45) Date of Patent: Oct. 5, 2021

(54) PROCESS FOR THE EXPLOITATION OF A DEPOSIT OF HYDROCARBONS BY INJECTION OF A POLYMER

(71) Applicant: IFP Energies nouvelles, Rueil-Malmaison (FR)

(72) Inventors: Christophe Preux, Rueil-Malmaison (FR); Iryna Malinouskaya, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 144 days.

(21) Appl. No.: 16/577,633

(22) Filed: Sep. 20, 2019

(65) Prior Publication Data
US 2020/0095850 A1    Mar. 26, 2020

(30) Foreign Application Priority Data

Sep. 20, 2018  (FR) .................................... 18/58.547

(51) Int. Cl.
| | | |
|---|---|---|
| *E21B 43/20* | (2006.01) | |
| *E21B 49/08* | (2006.01) | |
| *E21B 41/00* | (2006.01) | |
| *C09K 8/588* | (2006.01) | |
| *G01N 11/02* | (2006.01) | |

(52) U.S. Cl.
CPC .......... *E21B 41/0092* (2013.01); *C09K 8/588* (2013.01); *E21B 43/20* (2013.01); *E21B 49/0875* (2020.05); *G01N 11/02* (2013.01); *E21B 2200/20* (2020.05)

(58) Field of Classification Search
CPC .... E21B 49/0875; E21B 49/087; E21B 43/20; E21B 49/00; E21B 2200/20
See application file for complete search history.

(56) References Cited

U.S. PATENT DOCUMENTS

| | | | |
|---|---|---|---|
| 4,584,358 A | 4/1986 | McCormick et al. | |
| 8,271,248 B2* | 9/2012 | Pomerantz | .............. E21B 49/00 703/10 |
| 8,996,346 B2* | 3/2015 | Zuo | ......................... E21B 49/10 703/10 |
| 9,255,475 B2* | 2/2016 | Zuo | ......................... E21B 49/10 |
| 9,410,936 B2* | 8/2016 | Zuo | ......................... E21B 49/00 |
| 9,416,647 B2* | 8/2016 | Zuo | ......................... E21B 49/10 |
| 9,442,217 B2* | 9/2016 | Pomerantz | .............. G01V 9/00 |

FOREIGN PATENT DOCUMENTS

GB    2213850 A    8/1989

OTHER PUBLICATIONS

Preliminary Search Report for FR 18/585.47, dated May 21, 2019.
Abhinav Sharma et al.: "A Practical Method 1,7,9 to Calculate Polymer Viscosity Accurately in Numerical Reservoir Simulators", SPE Annual Technical Conference and Exhibition, (Oct. 31, 2011).

* cited by examiner

*Primary Examiner* — Catherine Loikith
(74) *Attorney, Agent, or Firm* — Fitch, Even, Tabin & Flannery LLP

(57) ABSTRACT

A process for the exploitation of a deposit of hydrocarbons by injection of an aqueous solution with polymer includes calibration of the constants involved in an analytical expression of a model for displacement of the polymer which is a function of at least the concentration and of another parameter, such as the salinity, the shear rate and the temperature.

14 Claims, 3 Drawing Sheets

PROCESS FOR THE EXPLOITATION OF A DEPOSIT OF HYDROCARBONS BY INJECTION OF A POLYMER

CROSS REFERENCE TO RELATED APPLICATIONS

Reference is made French Application No. 18/58.547 filed Sep. 20, 2018, which are incorporated herein by reference in their entirety.

BACKGROUND OF THE INVENTION

Field of the Invention

The present invention relates to the exploitation of a fluid present in a subterranean formation, more particularly to the enhanced recovery of a fluid, such as a hydrocarbon fluid, by injection of an aqueous solution comprising a polymer.

Description of the Prior Art

The exploitation of an oil reservoir by primary recovery extracts, via a "production" well, the oil present in the reservoir by the effect of excess pressure naturally prevailing within the reservoir. This primary recovery makes it possible to access only a small amount of the oil present in the reservoir, on the order of 10% to 15% at the very most.

In order to continue the extraction of the oil, secondary production methods are employed, when the pressure of the reservoir becomes insufficient to displace the oil still in place. In particular, a fluid is injected (reinjection of the produced water, diluted or undiluted, injection of sea or river water, or else injection of gas, for example) within the hydrocarbon reservoir, for the purpose of exerting, within the reservoir, an excess pressure capable of entraining the oil towards the production well or wells. A common technique in this context is the injection of water (also denoted by the term "waterflooding"), in which large volumes of water are injected under pressure into the reservoir via injection wells. The water injected entrains a part of the oil which it encounters and pushes it towards one or more production wells. The secondary production methods, such as the injection of water, make it possible, however, to extract only a relatively small part of the hydrocarbons in place (typically of the order of 30%). This partial sweeping is due in particular to the trapping of the oil by capillary forces, to the differences in viscosity and in density existing between the injected fluid and the hydrocarbons in place, and also to heterogeneities at micro- or macroscopic scales (scale of the pores and also scale of the reservoir).

In order to attempt to recover the remainder of the oil, which remains in the subterranean formations on conclusion of the implementation of the primary and secondary production methods, there exist various "enhanced oil recovery" (EOR) techniques. Mention may be made, among these techniques, of techniques similar to the abovementioned injection of water, but employing water comprising additives, such as surfactants and/or polymers.

Due to its high apparent viscosity, the injection of a water comprising a polymer is regarded as an alternative to the injection of water alone in hydrocarbon reservoirs. The mobility of the water with polymer is thus reduced with respect to the water alone, which, for its part, has a tendency to segregate and to rapidly penetrate through to the production wells, in particular in heterogeneous and/or thick reservoirs.

STATE OF THE ART

The following documents will be cited in the continuation of the description:

O. Smidsrod, A. Haug, (1971). Estimation of Relative Stiffness of the Molecular Chain in Polyelectrolytes from Measurements of Viscosity at Different Ionic Strengths, Biopolymers, 10, pp. 1213-1227.

H. Moradi (2011). Experimental Investigation of Polymer Flow Through Water- and Oil-Wet Porous Media, MSc, University of Stavanger, http://hdl.handle.net/11250/183351.

Carreau, P. J. (1972). Rheological Equations from Molecular Network Theories, J. Rheol., 16, pp 99-127, 10.1122/1.549276.

Chauveteau, G. (1982). Rodlike Polymer Solution Flow Through Fine Pores: Influence of Pore Size on the Rheological Behavior, J. Rheol., 26(2), pp 111-142.

Amus, T. C., 1982. The Unperturbed Molecular Dimensions of Polyethylene Oxide in Aqueous Solutions from Intrinsic Viscosity Measurements and the Evaluation of the Theta Temperature, Polymer, 23, pp 1775-1779.

H. Moradi (2011). Experimental Investigation of Polymer Flow Through Water- and Oil-Wet Porous Media, MSc, University of Stavanger, http://hdl.handle.net/11250/183351.

Preux, C., Malinouskaya, I., Nguyen, Q.-L., Tabary, R., 2018. Modeling and Simulating Multi-Polymer Injections, Society of Petroleum Engineers, doi:10.2118/190759-MS.

Byungln Choi, Moon Sik Jeong, Kun Sang Lee, Temperature-Dependent Viscosity Model of HPAM Polymer Through High-Temperature Reservoirs, Polymer Degradation and Stability, 110 (2014), 225-231.

Rodrigez, F., Rousseau, D., Bekri, S., Djabourov, M., & Bejarano, C. A. (2014, December 8). Polymer Flooding for Extra-Heavy Oil: New Insights on the Key Polymer Transport Properties in Porous Media. Society of Petroleum Engineers. doi:10.2118/172850-MS.

Huggins, M. L., 1941. Solutions of Long Chain Compounds, Journal of Chemical Physics, 9, p 440.

Luis Arnaut, Sebastiao Formosinho, Hugh Burrows, Chemical Kinetics, Elsevier, 2007, ISBN 9780444521866, https://doi.org/10.1016/B978-044452186-6/500006, (http://www.sciencedirect.com/science/article/pii/B9780444521866500006).

Vinogradov, G. V. and Malkin, A. Y., 1980. Rheology of Polymers, Mir Publishers/Springer-Verlag.

The oil exploitation of a deposit determines the zones of the deposit exhibiting the best oil potential, in defining exploitation plans for these zones (in order to define the type of recovery, the number and the positions of the exploitation wells making possible an optimum recovery of hydrocarbons), in drilling exploitation wells and, generally, in putting in place the production infrastructures necessary for the development of the deposit.

In the case of an enhanced recovery by injection of an aqueous solution comprising at least one polymer, the definition of an exploitation plan for an oil reservoir may require numerically simulating, in the most realistic way possible, the flows of this aqueous solution comprising the polymer in the reservoir under consideration. Such a simulation is carried out using a flow simulator comprising a model for displacement of the aqueous solution comprising the polymer, also commonly known as "model for displacement of the polymer".

Conventionally, the model for displacement of the polymer is based on the assumption that the water additivate with polymer will experience a reduction in its mobility. The formulation of such a model, used by numerous reservoir simulators, such as described, for example, in the document (Preux et al., 2018), thus results in modification of the viscosity of the water which is expressed according to a formula of the type:

$$\mu_{wp} = R_m(c,T,s,\gamma)\mu_w$$

where $\mu_w$ is the viscosity of the injection water, $\mu_{wp}$ is the viscosity of the water additivated with polymer and $R_m(c,T,s,\gamma)$ is a mobility reduction factor, which is generally a function of the concentration of polymer c, of the temperature T, of the salinity (or ionic strength) s and of the shear rate $\gamma$.

The determination of the model for displacement of the polymer thus comprises a stage of determining the mobility reduction factor $R_m$. In general, this assessment involves carrying out laboratory experiments, carried out on a rock sample originating from the subterranean formation being studied. However, the calibration of the polymer displacement model from the results of these laboratory tests is complex because the mobility reduction factor depends on several parameters (temperature, salinity (or ionic strength) and shear rate). In particular, the document (Byungln et al., 2014) solves the problem of the dependency on concentration and temperature. However, this document does not deal with dependencies on salinity and on the shear rate. Likewise, the document (Rodrigez et al., 2014) concerns the problem of the dependency on concentration and on shear rate but does not deal with dependencies on salinity and on temperature. Moreover, none of these documents mentions an experimental method which makes possible managing the multiple dependencies of the model for displacement of the polymer for the determination of the constants involved in the formulation of this model.

SUMMARY OF THE INVENTION

The present invention provides a rigorous process for carrying out the calibration of the constants involved in an analytical expression of the model for displacement of the polymer. This is because this methodology for calibration of the model for reduction of mobility of the polymer makes it possible to overcome the difficulties related to the dependency of the mobility reduction factor on numerous parameters (concentration of polymer, temperature, salinity (or ionic strength) and/or shear rate), while limiting the number of laboratory experiments to be carried out.

Thus, the present invention is a process for the exploitation of a subterranean formation comprising hydrocarbons by enhanced recovery, by using an injection of an aqueous solution comprising at least one polymer and of a flow simulator based on a model for displacement of the polymer in the formation. The model for displacement of the polymer is a function of at least one of concentration of polymer in the aqueous solution and of at least one parameter relating to at least one characteristic of the aqueous solution comprising the polymer. In addition, the process according to the invention comprises at least the following stages, carried out starting from at least one sample of the formation:

A. constants involved in an analytical expression of the model are determined according to at least the following stages:
   a) a plurality of measurements of apparent viscosity are carried out on the sample for a plurality of concentrations of the polymer in the aqueous solution and for a first value of the parameter;
   b) a first value of intrinsic viscosity and a first value of a Huggins coefficient are determined from the measurements of apparent viscosity carried out for the first value of the parameter;
   c) stage a) is repeated for a second value of the parameter;
   d) at least one second value of intrinsic viscosity is determined from the measurements of apparent viscosity carried out for the second value of the parameter; and
   e) starting at least from the first and second values of the intrinsic viscosity and from at least the first value of the Huggins coefficient, the values of the constants involved in the analytical expression of the model for displacement of the polymer are determined; and B. starting from the analytical expression of the displacement model and from the flow simulator, a plan for exploitation of the formation is determined and the hydrocarbons of the formation are exploited according to the exploitation plan.

According to one implementation of the invention, the parameter $V_i$ can correspond to the salinity, to the shear rate or to the temperature of the aqueous solution comprising the polymer.

According to one implementation of the invention, it is possible to determine the value of at least one of the intrinsic viscosity and the value of the Huggins coefficient in the following way:
   starting from the measurements of apparent viscosity carried out for the first or the second value of the parameter, a curve representative of the change in the reduced specific viscosity as a function of the concentration is determined;
   a tangent to the curve is determined for the lowest concentration values;
   the value of the intrinsic viscosity is determined from the ordinate at the source of the tangent and the value of the Huggins coefficient is determined from the slope of the tangent.

Preferably, the model for displacement of the polymer can be expressed in a form of the type:

$$\mu_{wp} = R_m(c,V_i)\cdot\mu_w$$

where $\mu_w$ is the viscosity of the aqueous solution without polymer, $\mu_{wp}$ is the viscosity of the aqueous solution comprising the polymer and $R_m(c,V_i)$ is a mobility reduction factor as a function of the concentration c and of the parameter $V_i$, and where the mobility reduction factor is expressed according to an analytical expression of the type:

$$R_m(c,V_i) = 1 + [\mu(V_i)]c + k'(V_i)\cdot([\mu(V_i)]c)^2$$

where:
   $[\mu(V_i)]$ is an analytical expression of the intrinsic viscosity of the aqueous solution comprising the polymer, as a function of the parameter $V_i$;
   $k'(V_i)$ is an analytical expression of the Huggins coefficient, as a function of the parameter $V_i$; and
   the analytical expressions of the intrinsic viscosity and of the Huggins coefficient are a function of the constants.

According to one implementation of the invention, the intrinsic viscosity can be expressed according to a formula of the type:

$$[\mu(V_i)] = \Pi_i F_i(V_i)$$

where $F_i$ is an interpolation function which depends at least on the parameter $V_i$.

According to one implementation of the invention, the model can be a function of the concentration and of at least the parameter $V_i$ corresponding to the salinity s of the aqueous solution, and in which the interpolation function $F_i$ is written in a form of the type:

$$F_1(s) = [\mu_0] + b_I I_\mu^{-1/2}(s)$$

where $I_\mu$ is an ionic strength of the aqueous solution, and where the constants $[\mu_0]$ and b1 are determined according to formulae of the type:

$$b_I = \frac{[\mu]_2 - [\mu]_1}{(I_\mu(s_2))^{-1/2} - (I_\mu(s_1))^{-1/2}}$$

$$[\mu_0] = [\mu]_2 - b_I(I_\mu(s_2))^{-1/2}$$

where $s_1$ and $s_2$ are the first and second values of the parameter $V_i$ corresponding to the salinity, and $[\mu]_1$ and $[\mu]_2$ are respectively the first and second values of the intrinsic viscosity determined starting from the measurements of apparent viscosity carried out respectively for the first and second values of the parameter $V_i$ corresponding to the salinity.

According to one implementation of the invention, the model can be a function of the concentration and of at least the parameter $V_i$ corresponding to the shear rate $\dot{\gamma}$ of the aqueous solution comprising the polymer, and in which the interpolation function $F_i$ is written as:

$$F_2(\dot{\gamma}) = 1 \Big/ \left[1 + \left(\frac{\dot{\gamma}}{\dot{\gamma}_c}\right)^2\right]^{\log\left(\frac{[\mu]_1}{[\mu]_3}\right) / \log\left(1 + \left[\frac{\gamma_2}{\gamma_c}\right]^2\right)}$$

where $\dot{\gamma}_c$ is a characteristic shear rate, $\gamma_2$ is the second value of the parameter $V_i$ corresponding to the shear rate, and the constants $[\mu]_1$ and $[\mu]_3$ are respectively the first and second values of the intrinsic viscosity determined starting from the measurements of apparent viscosity carried out respectively for the first and second values of the parameter $V_i$ corresponding to the shear rate.

According to one implementation of the invention, the model can be a function of the concentration and of at least the parameter $V_i$ corresponding to the temperature T of the aqueous solution comprising the polymer, and in which the interpolation function is written as:

$$F_3(T) = \left(\frac{[\mu]_1}{[\mu]_4}\right)^{\frac{\left(\frac{1}{T} - \frac{1}{T_1}\right)}{\left(\frac{1}{T_1} - \frac{1}{T_2}\right)}}$$

where $T_1$ and $T_2$ are the first and second values of the parameter $V_i$ corresponding to the temperature, and the constants $[\mu]_1$ and $[\mu]_4$ are respectively the first and second values of the intrinsic viscosity determined starting from the measurements of apparent viscosity carried out respectively for the first and second values of the parameter $V_i$ corresponding to the temperature.

According to one implementation of the invention, the model can be a function of the concentration and of a single parameter $V_i$ corresponding to the salinity of the aqueous solution, and in which, in d), a second value of the Huggins coefficient is additionally determined starting from the measurements of apparent viscosity carried out for the second value of the parameter $V_i$ corresponding to the salinity, and in which the analytical expression of the Huggins coefficient is written according to a formula of the type:

$$k'(s) = \alpha_I I_\mu(s) + \beta_I$$

where the constants $\alpha_I$ and $\beta_I$ are determined according to formulae of the type:

$$\alpha_I = \frac{k'_1 - k'_2}{I_\mu(s_1) - I_\mu(s_2)}$$

$$\beta_I = k'_2 - \alpha_I I_\mu(s_2)$$

where $s_1$ and $s_2$ are the first and second values of the parameter $V_i$ corresponding to the salinity, $k'_1$ and $k'_2$ are respectively the first and second values of the Huggins coefficient determined starting from the measurements of apparent viscosity carried out respectively for the first and second values of the parameter $V_i$ corresponding to the salinity.

According to one implementation of the invention, the model can be a function of the concentration and of a single parameter $V_i$ corresponding to the shear rate of the aqueous solution, and in which the Huggins coefficient is a constant and corresponds to the first value of the Huggins coefficient determined starting from the measurements of apparent viscosity carried out for the first value of the parameter $V_i$ corresponding to the shear rate.

According to one implementation of the invention, the model can be a function of the concentration and of a single parameter $V_i$ corresponding to the temperature of the aqueous solution, and in which, in d), a second value of the Huggins coefficient is additionally determined starting from the measurements of apparent viscosity carried out for the second value of the parameter $V_i$ corresponding to the temperature, and in which the analytical expression of the Huggins coefficient is written as:

$$k'(s) = \alpha_T T + \beta_T$$

where the constants $\alpha_T$ and $\beta_T$ are determined according to formulae:

$$\alpha_T = \frac{k'_1 - k'_4}{T_1 - T_2}$$

$$\beta_T = k'_1 - \frac{k'_1 - k'_4}{T_1 - T_2} T_1$$

where $T_1$ and $T_2$ are the first and second values of the parameter $V_i$ corresponding to the temperature, $k'_1$ and $k'_4$ are respectively the first and second values of the Huggins coefficient determined starting from the measurements of apparent viscosity carried out respectively for the first and second values of the parameter $V_i$ correspond to the temperature.

According to one implementation of the invention, the model can be a function of the concentration and of at least two parameters $V_i$, the two parameters $V_i$ corresponding to the salinity and to the temperature of the aqueous solution, and in which:

i) a) and b) are applied for at least one first value $s_1$ of the salinity and for at least one first value $T_1$ of the temperature;

ii) c) and d) are applied for a second value $s_2$ of the salinity and for the first value $T_1$ of the temperature, and a value $k'_2$ of the Huggins coefficient is additionally determined; and iii) c) and d) are applied for a second value $T_2$ of the temperature and for the first value $s_1$ of the salinity, and a value $k_4'$ of the Huggins coefficient is additionally determined; and iv) measurements of apparent viscosity are carried out for a plurality of concentrations of the polymer in the aqueous solution for the second value of the salinity and the second temperature value, and a value $k_5'$ of the Huggins coefficient is determined, and in which the analytical expression of the Huggins coefficient is written according to a formula:

$$k'(I_\mu, T) = (\alpha_1 T + \beta_1) I_\mu + (\alpha_2 T + \beta_2)$$

with the constants $$\alpha_1 = \frac{\alpha_I - \alpha_{I,2}}{T_1 - T_2},$$

$$\alpha_2 = \frac{\beta_I - \beta_{I,2}}{T_1 - T_2},$$

$$\beta_1 = \frac{T_1 \alpha_{I,2} - T_2 \alpha_I}{T_1 - T_2} \text{ and}$$

$$\beta_2 = \frac{T_1 \beta_{I,2} - T_2 \beta_I}{T_1 - T_2} \text{ and}$$

$$\alpha_I = \frac{k_2' - k_1'}{s_2 - s_1},$$

$$\alpha_{I,2} = \frac{k_5' - k_4'}{s_2 - s_1},$$

$$\beta_I = k_1' - \frac{k_2' - k_1'}{s_2 - s_1} s_1 \text{ and}$$

$$\beta_{I,2} = k_4' - \frac{k_5' - k_4'}{s_2 - s_1} s_1,$$

where $k_1'$ is the first value of the Huggins coefficient determined starting from the measurements of apparent viscosity carried out during the stage a).

Preferentially, by the flow simulator incorporating the analytical expression of the model for displacement of the polymer, it is possible to evaluate exploitation plans according to at least one predefined criterion, and the hydrocarbons of the formation are exploited according to the plan satisfying the criterion.

Advantageously, the hydrocarbons of the formation can be exploited by injecting the aqueous solution comprising the polymer, by drilling at least one injection well and at least one production well of the exploitation plan, and by installing production infrastructures suited to the development of the deposit.

Other characteristics and advantages of the process according to the invention will become apparent on reading the description below of nonlimiting implementational examples, with reference to the appended figures described below.

DETAILED DESCRIPTION OF THE INVENTION

Figure 1:
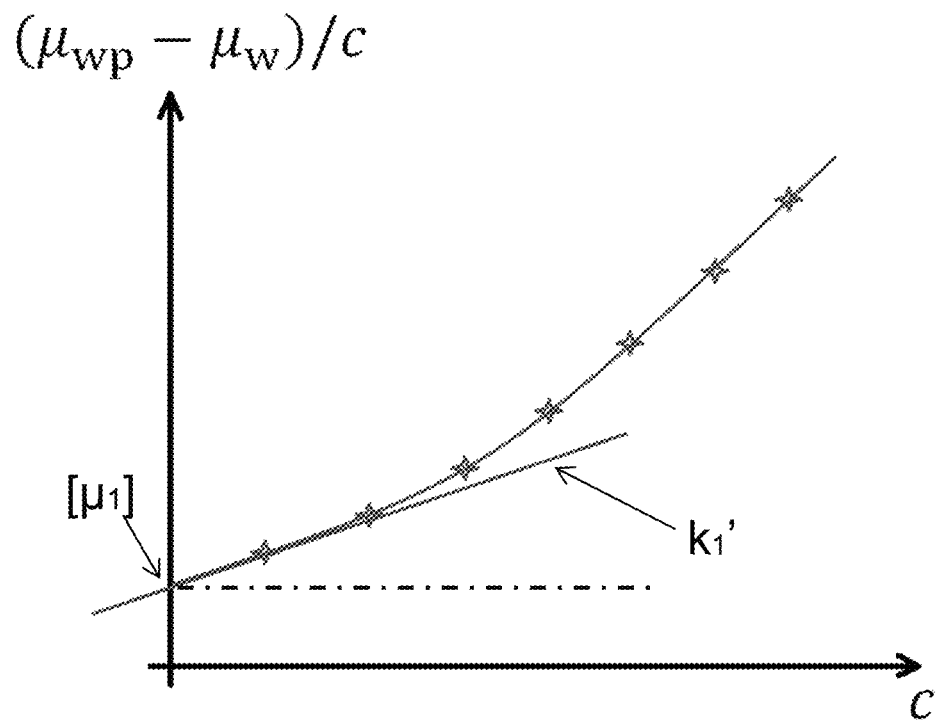
FIG. 1 illustrates a curve representative of the change in the reduced specific viscosity as a function of the concentration.

Generally, one of the subject matters of the invention relates to a process for exploitation of a subterranean formation comprising hydrocarbons, by use of an injection of an aqueous solution comprising at least one polymer, and in particular to the determination of a plan for exploitation of the hydrocarbons of the subterranean formation being studied.

In particular, the process according to the invention is targeted at determining the constants involved in an analytical expression of the model for displacement of the aqueous solution comprising the polymer, subsequently known as "model for displacement of the polymer" with this displacement model subsequently being used in a numerical simulator of the flows.

The process according to the invention requires having available:
a sample of the subterranean formation being studied, withdrawn by in situ core sampling, for example; and
a flow simulator based on a model for displacement of the polymer (compare. below).

According to the invention, use is made of a model for displacement of the polymer defined according to a formula:

$$\mu_{wp} = R_m(c, T, s, \gamma) \mu_w \qquad (1)$$

where $\mu_w$ is the viscosity of the aqueous solution without polymer, $\mu_{wp}$ is the viscosity of the aqueous solution additivated with the polymer and $R_m$ is the mobility reduction factor.

According to the invention, the mobility reduction factor is a function of the concentration of polymer, denoted c below, and of at least one parameter $V_i$ relating to at least one characteristic of the aqueous solution comprising the polymer.

According to a first alternative embodiment of the invention, which will be described in more detail below, the parameter $V_i$ corresponds to the salinity (or ionic strength), subsequently denoted s. The mobility reduction factor $R_m$ is then a function of the concentration of polymer c and of the salinity s, and can be written $R_m(c,s)$.

According to a second alternative embodiment of the invention which will be described in detail below, the parameter $V_i$ corresponds to the shear rate, subsequently denoted $\dot{\gamma}$. The mobility reduction factor $R_m$ is then a function of the concentration of polymer c and of the shear rate $\dot{\gamma}$, and can be written $R_m(c,T)$.

According to a third alternative embodiment of the invention which will be described in detail below, the parameter $V_i$ corresponds to the temperature, subsequently denoted T. The mobility reduction factor $R_m$ is then a function of the concentration of polymer c and of the temperature T, and can be written $R_m(c,T)$.

According to a fourth alternative embodiment of the invention, the mobility reduction factor $R_m$ is a function of the concentration of polymer c and of two parameters $V_i$, which are the temperature T and the salinity (or ionic strength) s, and can be written $R_m(c,T,s)$.

According to a fifth alternative embodiment of the invention, the mobility reduction factor $R_m$ is a function of the concentration of polymer c and of three parameters $V_i$, which are the temperature T, the salinity (or ionic strength) s and the shear rate $\gamma$, and can be written $R_m(c,T,s,\gamma)$.

According to one embodiment of the invention, the expression proposed by Huggins and described in the document (Huggins, 1941) is used to define the dependency of the mobility reduction factor, that is an analytical expression of the form:

$$R_m(c, V_i) = 1 + [\mu(V_i)]c + k'(V_i) \cdot ([\mu(V_i)]c)^2 \quad (2)$$

where:
- $[\mu(V_i)]$ is the intrinsic viscosity of the aqueous solution with polymer or, in other words, the "viscosifying power" of the polymer. This quantity represents the expansion volume of the polymer in a water of given salinity at given temperature and shear rate and is expressed in general in $cm^3/g$ or in liter/g.
- $k'(V_i)$ is a coefficient known under the term of "Huggins coefficient". It is a dimensionless number, having a value, for example, of 0.4 for a polymer of HPAM type diluted in an aqueous sodium chloride solution suited to this molecule.
- $V_i$ is a parameter relating to at least one characteristic of the aqueous solution comprising the polymer, other than the concentration of polymer in the aqueous solution.

According to one implementation of the invention, the intrinsic viscosity of the aqueous solution with the polymer involved in the formula of the mobility reduction factor defined according to the equation (2) above can be written according to a formula:

$$[\mu(V_i)] = \Pi_i F_i(V_i) \quad (3)$$

where the $F_i$ are interpolation functions which each depend on a single parameter $V_i$ relating to at least one characteristic of the aqueous solution comprising the polymer, and which involve constants, the calibration of which is one of the subject matters of the present invention. According to one implementation of the invention, the parameter $V_i$ can in particular be the salinity s, the shear rate f or also the temperature T of the aqueous solution comprising the polymer.

Subsequently and nonlimitingly, the following are noted:
- $F_1$ is the interpolation function relating to the parameter $V_1$ corresponding to the salinity of the aqueous solution comprising the polymer;
- $F_2$ is the interpolation function relating to the parameter $V_2$ corresponding to the shear rate of the aqueous solution comprising the polymer; and
- $F_3$ is the interpolation function relating to the parameter $V_3$ corresponding to the temperature of the aqueous solution comprising the polymer.

According to one implementation of the invention, the Huggins coefficient of the aqueous solution with the polymer involved in the formula of the mobility reduction factor defined according to the equation (2) above can be written according to several formulas:

in the case of a dependency on the salinity alone:

$$k'(s) = \alpha_I I_\mu(s) + \beta_I \quad (4a)$$

in the case of a dependency on the shear rate alone:

$$k'(\dot{\gamma}) = \text{const} \quad (4b)$$

in the case of a dependency on the temperature alone:

$$k'(T) = a_T T + \beta_T \quad (4c)$$

in the case of a dependency on the salinity and on the temperature:

$$k'(I_\mu, T) = (\alpha_1 T + \beta_1) I_\mu + (\alpha_2 T + \beta_2) \quad (4d).$$

The calibration of the constants involved in the equations (4a) to (4d) is one of the subject matters of the present invention.

The process according to the invention comprises at least the following:
1. Measurements of apparent viscosity for a plurality of concentrations
2. Repetition of 1 for a different measurement condition
3. Determination of the model for displacement of the polymer
4. Exploitation of the hydrocarbons of the formation According to alternative forms of the invention which will be described in detail below, 2 is repeated when the model for displacement of the polymer is a function of more than one parameter $V_i$ relating to at least one characteristic of the aqueous solution comprising the polymer.

The different stages of the process according to the invention are described in detail below.

1. Measurements of Apparent Viscosity for a Plurality of Concentrations

During this stage, a plurality of measurements of apparent viscosity are carried out on a rock sample originating from the geological reservoir being studied, starting from a plurality of aqueous solutions comprising the polymer being studied present according to predefined concentrations $\{c_1, \ldots, c_N\}$ and for a first value of the parameter $V_i$ relating to at least one characteristic of the aqueous solution comprising the polymer.

Subsequently and for purposes of simplification of the explanation of the process according to the invention, "reference measurement conditions" refers to the conditions under which the measurements of apparent viscosity of step 1 of the process according to the invention are carried out. These reference conditions comprise a reference value for at least each of the parameters $V_i$ relating to a characteristic of the aqueous solution comprising the polymer as are defined above, that is, for example, a value of salinity $s_1$, at least one of a value of the shear rate $\dot{\gamma}_1$ and a value of temperature $T_1$. According to the invention, the conditions for measurement of the apparent viscosity are unchanged from one concentration to the other for one and the same value of the parameter $V_i$.

According to one implementation of the invention, the apparent viscosity for a given concentration is measured by injection, into the rock sample, of an aqueous solution comprising the polymer present according to this concentration, and a loss of head that is, a difference in pressure between the upstream and the downstream of the rock sample under consideration, measured, for example, by pressure sensors positioned upstream and downstream of the sample for this concentration is measured. This measurement of apparent viscosity is repeated for each of the predefined concentrations of polymer. For this purpose, samples of aqueous solution each comprising an amount of polymer according to one of the predefined concentrations $\{c_1, \ldots, c_N\}$, will have been prepared beforehand.

Starting from the measurements of loss of head, an apparent viscosity $\mu_{app}$ of the aqueous solution with polymer is determined for each of the concentration values according to a formula $$\mu_{app} = \frac{k \nabla P}{u_t} \text{ where } \nabla P = \frac{\Delta P}{L}$$

is the pressure gradient measured under steady conditions of flow through the sample of porous medium for a given value of the concentration of polymer, L is the length of the rock sample under consideration, $\Delta P$ is the loss of head measured between the upstream and the downstream of this sample for the concentration value under consideration, $u_t$ is the total velocity and k is the permeability of the rock sample withdrawn.

Starting from the apparent viscosity measured for each concentration, a value of intrinsic viscosity, denoted $[\mu]_1$, and a value of the Huggins coefficient, denoted $k_1'$, relative to these reference conditions, are determined.

According to one implementation of the invention, starting from these measurements, a curve representative of the variation in the reduced specific viscosity as a function of the concentration, defined according to $\mu_{sr}(c)=(\mu_{app}-\mu_w)/c$, with $\mu_w$ being the viscosity of the aqueous solution without polymer, is determined and the value of the intrinsic viscosity $[\mu]_1$ and the value of the Huggins coefficient $k_1'$ are determined as being respectively the intersection at the source and the slope of the tangent to the curve representative of the variation in the reduced specific viscosity for the lowest concentrations. In other words, the intrinsic viscosity $[\mu]_1$ corresponds to the limit of the reduced specific viscosity when the concentration of polymer tends towards zero.

According to one implementation of the invention, the values of intrinsic viscosity $[\mu]_1$ and of the Huggins coefficient $k'_1$ relating to these measurement conditions are determined graphically or by a linear regression carried out numerically. FIG. 1 represents an illustrative example of curve (compare. the continuous curve passing through measurement points represented by stars) representing the change in the reduced specific viscosity $(\mu_{app}-\mu_w)/c$ as a function of the concentration c. The graphical determination of the values of intrinsic viscosity $[\mu]_1$ (the ordinate at the source of the straight tangent line, represented as solid line, to the curve of reduced specific viscosity for the lowest concentration values) and of the Huggins coefficient $k_1'$ (slope of the straight tangent line, represented as solid line, to the curve of reduced specific viscosity for the lowest concentration values), relating to the reference measurement conditions, is also illustrated in this figure.

According to one embodiment of the invention, the injections of aqueous solution with polymer are carried out on samples of the formation which are initially saturated with a liquid phase (such as water and/or oil). It is possible for the liquid phase to be mobile or residual depending on the history of the core and the measurement objectives (control of mobility of the polymer in secondary or tertiary injection, after injection of water). The displacements being studied are then draining processes in which the saturation of the water phase increases in all the cases.

2. Repetition of 1 for a Different Measurement Condition

According to the invention, stage 1 above is repeated at least once, under the same reference conditions, except for a value of one of the parameters $V_i$ different from the value used for 1, and at least one value of intrinsic viscosity, denoted $[\mu]_{i+1}$, is determined for this second value of the parameter $V_i$ starting from the measurements of apparent viscosities carried out for the second value of the parameter $V_i$.

According to one implementation of the invention according to which the displacement model is a function at least one of the salinity and the temperature, a value of Huggins coefficient, denoted $k_{i+1}'$, is additionally determined for this second value of the parameter $V_i$.

2.1—Alternative Form 1: Dependency on the Salinity

According to a first alternative embodiment of the invention in which the model for displacement of the polymer is at least dependent on the salinity of the aqueous solution with polymer, 1 is repeated for a second value of the salinity $s_2$, distinct from the first value of salinity $s_1$ of the reference conditions used for the implementation of stage 1 with the other reference conditions and the measurement method being unchanged.

According to this first alternative form, a value of intrinsic viscosity, denoted $[\mu]_2$, and a value of the Huggins coefficient, denoted $k_2'$, are then determined starting from the measurements of apparent viscosity carried out for the second value of the salinity, in the way described in section 1 for the determination of the values of intrinsic viscosity $[\mu]_1$ and of the Huggins coefficient $k_1'$.

2.2—Alternative Form 2: Dependency on the Shear Rate

According to a second alternative embodiment of the invention in which the model for displacement of the polymer is dependent on the shear rate of the aqueous solution with polymer, stage 1 is repeated for a second value of the shear rate $\dot{\gamma}_2$, distinct from the first value of the shear rate $\dot{\gamma}_1$ of the reference conditions used for the implementation of stage 1, the other reference conditions and the measurement method being unchanged.

According to this second alternative form, a value of intrinsic viscosity, denoted $[\mu]_3$, is then determined from the measurements of apparent viscosity carried out for the second value of the shear rate, in the way described in stage 1 for the determination of the value of intrinsic viscosity $[\mu]_1$.

2.3—Alternative Form 3: Dependency on the Temperature

According to a third alternative embodiment of the invention in which the model for displacement of the polymer is dependent on the shear rate of the aqueous solution with polymer, stage 1 is repeated for a second value of temperature $T_2$ distinct from the first value of temperature $T_1$ of the reference conditions used for the implementation of stage 1 with, the other reference conditions and the measurement method being unchanged.

According to this third alternative form, a value of intrinsic viscosity, denoted $[\mu]_4$, and a value of the Huggins coefficient, denoted $k_4'$, are then determined starting from the plurality of measurements of apparent viscosity carried out for the second value of temperature, in the way described in stage 1 for the determination of the values of intrinsic viscosity $[\mu]_1$ and of the Huggins coefficient $k_1'$.

2.4—Alternative Form 4: Dependency on the Salinity and on the Temperature

According to a fourth alternative embodiment of the invention according to which the model for displacement of the polymer is dependent on the salinity and on the temperature of the aqueous solution with polymer, 2 is applied:
  according to the first alternative form described in stage 2.1 above, in order to determine a value of intrinsic viscosity $[\mu]_2$ and a value of the Huggins coefficient $k_2'$;
  according to the third alternative form described in stage 2.3 above, in order to determine a value of intrinsic viscosity denoted $[\mu]_4$ and a value of the Huggins coefficient denoted $k_4'$.

According to this fourth alternative embodiment of the invention, measurements of apparent viscosities are additionally carried out for the second value of salinity $s_2$ of the first alternative form and for the second value of temperature $T_2$ of the third alternative with form, the other reference conditions being unchanged, and a value of Huggins coefficient, denoted $k_5'$, is determined from the measurements of apparent viscosity carried out as described in section 1 for the determination of the value of the Huggins coefficient $k_1'$.

It is very obvious that these successive measurements of apparent viscosity can be carried out according to any order.

2.5—Alternative Form 5: Dependency on the Salinity, on the Shear Rate and on the Temperature According to a fifth alternative embodiment of the invention according to which the model for displacement of the polymer is at least dependent on the salinity, on the temperature and on the shear rate of the aqueous solution with polymer, stage 2 of the process according to the invention is applied according to the second and fourth alternative forms respectively described in stages 2.2 and 2.4 above.

In other words, the fifth alternative form of the process according to the invention comprises the implementation of stage 2 of the process according to the invention according to at least its first alternative form (compare stage 2.1), its second alternative form (cf. section 2.2) and according to its third alternative form (cf. stage 2.3), and moreover comprises an additional stage of measurements of apparent viscosity carried out for the second value of salinity and of temperature. It is very obvious that these successive measurements of apparent viscosity can be carried out according to any order.

3. Determination of the Model for Displacement of the Polymer

During this stage, the constants involved in an analytical expression of the model for displacement of the polymer are determined, starting from the values of intrinsic viscosity and of the Huggins coefficient determined during stages 1 and 2 described above.

According to a preferred implementation of the invention, the model for displacement of the polymer is expressed according to equation (2) defined above, and the values of the constants involved in the analytical expression of the intrinsic viscosity according to equation (3) and the analytical expression of the Huggins coefficient according to equations (4a), (4b), (4c) and (4d) are then determined.

3.1 Alternative Form 1: Dependency on the Salinity

According to the first alternative embodiment of the invention according to which the model for displacement of the polymer is dependent at least on the salinity of the aqueous solution with polymer, an interpolation function $F_1$ dependent on the parameter $V_1$ corresponding to the salinity s is determined according to a formula:

$$F_1(s) = [\mu_0] + b_I I_\mu^{-1/2}(s) \quad (5)$$

where $I_\mu$ is the ionic strength of the aqueous sodium chloride solution or salinity and $[\mu_0]$ is the intrinsic viscosity when the ionic strength tends towards infinity. The ionic strength can be estimated conventionally as a function of the composition of the salt. If working with overall salinity, the relationship $I_\mu(s) = s$ exists. If working with a compositional view of the water, then the ionic strength is a function of the composition of the water, and is written as:

$$I_\mu(s) = \tfrac{1}{2} \Sigma_i C_i z_i^2 \quad (6)$$

where $C_i$ represents the molar concentration of the ion i and $z_i$ its charge, as described in the document (Arnaut et al., 2007).

According to one implementation of the invention, the constants $[\mu_0]$ and b1 are determined according to the formulae of the type:

$$b_I = \frac{[\mu]_2 - [\mu]_1}{(I_\mu(s_2))^{-1/2} - (I_\mu(s_1))^{-1/2}} \quad (7)$$

$$[\mu_0] = [\mu]_2 - b_I (I_\mu(s_2))^{-1/2} \quad (8)$$

where $[\mu]_1$ and $[\mu]_2$ are the values of intrinsic viscosity determined during stages 1 and 2 respectively, stage 2 is applied according to at least the present first alternative embodiment of the invention for the value of salinity $s_2$ (compare stage 2.1 above).

According to this first alternative embodiment of the invention and when the model for displacement of the polymer is solely a function of the salinity, there is additionally determined the Huggins coefficient as a function of the salinity according to equation (4a) above, i.e.:

$$k'(s) = \alpha_I I_\mu(s) + \beta_I \quad (4a),$$

The constants $\alpha_I$ and $\beta_I$ involved in the equation (4a) are determined according to formulae:

$$\alpha_I = \frac{k_1' - k_2'}{I_\mu(s_1) - I_\mu(s_2)} \quad (9)$$

$$\beta_I = k_2' - \alpha_I I_\mu(s_2) \quad (10)$$

where $k'_1$ and $k'_2$ are values determined during stages 1 and 2 respectively, stage 2 being applied according to at least the first alternative embodiment of the invention for the second value of salinity $s_2$ (compare section 2.1 above).

3.2—Alternative Form 2: Dependency on the Shear Rate

According to the second alternative embodiment of the invention according to which the model for displacement of the polymer is at least dependent on the shear rate, the interpolation function $F_2$ dependent on the parameter $V_2$ corresponding to the shear rate of the aqueous solution comprising the polymer is determined according to a formula of the model defined in the document (Carreau, 1972):

$$F_2(\dot{\gamma}) = 1 \Big/ \left[ 1 + \left(\frac{\dot{\gamma}}{\dot{\gamma}_c}\right)^2 \right]^{\log\left(\frac{[\mu]_1}{[\mu]_3}\right) / \log\left(1 + \left[\frac{\gamma_2}{\gamma_c}\right]^2\right)} \quad (11)$$

where $\dot{\gamma}_c$ is a characteristic shear rate and $[\mu]_1$ and $[\mu]_3$ are the values of intrinsic viscosity determined during stages 1 and 2 respectively, stage 2 being applied according to at least the present second alternative form for the second value of shear rate $\dot{\gamma}_2$ (compare stage 2.2 above). According to one implementation of the invention, the characteristic shear rate $\gamma_c$ is as defined in the document (Chauveteau, 1982) and can be expressed according to a formula:

$$\dot{\gamma}_c = a \frac{4u}{r_h} \quad (12)$$

where:

a is a shape parameter characteristic of the structure of the pores. The value of a should be one for a bundle of capillaries having the same diameter. For porous media, the value of a is determined experimentally as being that which gives the same $\dot{\gamma}_c$ corresponding to the beginning of the thinning behaviour by shearing both for the shearing viscosity/shear rate curve and the apparent viscosity/shear rate curve in the porous media under consideration. (compare Chauveteau, 1982). For example, a=1.7 for piles of large spheres of the same diameter, a=2.5 for beds of packed angular grains;

$$u = \frac{Q}{\varphi S},$$

where Q is the flow rate, S is the section of the medium and φ is the porosity;

$$r_h = \sqrt{\frac{8K}{\varphi}},$$

where K is the permeability.

According to this second alternative embodiment of the invention and when the model for displacement of the polymer is solely a function of the shear rate, the Huggins coefficient is constant (compare equation 4b) and the value of the constant is the value of the Huggins coefficient determined in stage 1, i.e. $k'(\dot{\gamma}) = \text{const} = k_1'$.

3.3—Alternative Form 3: Dependency on the Temperature

According to the third alternative embodiment of the invention according to which the model for displacement of the polymer is at least dependent on the temperature, the interpolation function $F_3$ dependent on the parameter $V_3$ corresponding to the temperature T of the aqueous solution comprising the polymer is determined according to a formula:

$$F_3(T) = \frac{[\mu]_1}{[\mu]_4} \left( \frac{\left(\frac{1}{T} - \frac{1}{T_1}\right)}{\left(\frac{1}{T_1} - \frac{1}{T_2}\right)} \right) \tag{13}$$

where $[\mu]_1$ and $[\mu]_4$ are the values of intrinsic viscosity determined during 1 and 2 respectively, with stage 2 being applied according to at least the present third alternative form for the value of temperature $T_2$ (compare stage 2.3 above).

According to this third alternative form of the invention and when the model for displacement the polymer is dependent solely on the temperature, the Huggins coefficient as a function of the temperature can be defined according to a formula:

$$k'(T) = \alpha_T T + \beta_T \tag{4c}$$

with $$\alpha_T = \frac{k_1' - k_4'}{T_1 - T_2} \tag{14}$$

$$\beta_T = k_1' - \frac{k_1' - k_4'}{T_1 - T_2} T_1 \tag{15}$$

where $k'_1$ and $k'_4$ are the values determined during 1 and 2, with 2 being applied according to at least the present third alternative for the second value of temperature $T_2$ (compare stage 2.3 above).

3.4—Alternative Form 4: Dependency on the Salinity and on the Temperature

According to the fourth alternative embodiment of the invention according to which the model for displacement of the polymer is dependent on the salinity and on the temperature, the following are determined:

- an analytical expression of the intrinsic viscosity by incorporating the formulae (5) and (13) in equation (3). In order to do this, the constants involved in the interpolation function $F_1$, which is dependent on the parameter $V_1$ corresponding to the salinity, as described above in stage 3.1, and the constants involved in the interpolation function $F_3$ which is dependent on the parameter $V_3$ corresponding to the temperature, as described above in stage 3.3, are determined.
- an analytical expression of the Huggins coefficient according to equation (4d), that is:

$$k'(I_\mu, T) = (\alpha_1 T + \beta_1) I_\mu + (\alpha_2 T + \beta_2) \text{ with} \tag{4d}$$

$$\alpha_1 = \frac{\alpha_I - \alpha_{I,2}}{T_1 - T_2} \tag{16}$$

$$\alpha_2 = \frac{\beta_I - \beta_{I,2}}{T_1 - T_2} \tag{17}$$

$$\beta_1 = \frac{T_1 \alpha_{I,2} - T_2 \alpha_I}{T_1 - T_2} \tag{18}$$

$$\beta_2 = \frac{T_1 \beta_{I,2} - T_2 \beta_I}{T_1 - T_2} \text{ and} \tag{19}$$

$$\alpha_I = \frac{k_2' - k_1'}{s_2 - s_1} \tag{20}$$

$$\alpha_{I,2} = \frac{k_5' - k_4'}{s_2 - s_1} \tag{21}$$

$$\beta_I = k_1' - \frac{k_2' - k_1'}{s_2 - s_1} s_1 \tag{22}$$

$$\beta_{I,2} = k_4' - \frac{k_5' - k_4'}{s_2 - s_1} s_1, \tag{23}$$

where $k'_1$, $k'_2$, $k'_4$ and $k'_5$ are values determined during 1 and 2, with 2 being applied according to the fourth alternative form (compare stage 2.4 above).

3.5—Alternative Form 5: Dependency on the Salinity, on the Shear Rate and on the Temperature According to the fifth alternative embodiment of the invention according to which the model for displacement of the polymer is at least dependent on the salinity, on the shear rate and on the temperature, the following are determined:

- an analytical expression of the intrinsic viscosity by incorporating the formulae (5), (11) and (13) in equation (3), that is according to a formula:

$$[\mu](s, \dot{\gamma}, T) = \tag{24}$$

$$\frac{[\mu]_2 - ([\mu]_2 - [\mu]_1) \frac{I_\mu(s_2)^{-1/2} - I_\mu(s)^{-1/2}}{I_\mu(s_2)^{-1/2} - I_\mu(s_1)^{-1/2}}}{\left[1 + \left(\frac{\dot{\gamma}}{\dot{\gamma}_c}\right)^2\right]^{\log\left(\frac{[\mu]_1}{[\mu]_3}\right)/\log\left(1 + \left[\frac{\dot{\gamma}_2}{\dot{\gamma}_c}\right]^2\right)}} \left(\frac{[\mu]_1}{[\mu]_4}\right)^{\left\{\frac{\left(\frac{1}{T} - \frac{1}{T_1}\right)}{\left(\frac{1}{T_1} - \frac{1}{T_2}\right)}\right\}}$$

- an analytical expression of the Huggins coefficient by incorporating the formulae (16) to (19) in equation (4d), that is according to a formula of the type:

$$k'(I_\mu, T) = \left(\frac{\alpha_I - \alpha_{I,2}}{T_1 - T_2} T + \frac{T_1 \alpha_{I,2} - T_2 \alpha_I}{T_1 - T_2}\right) I_\mu + \tag{25}$$

$$\left(\frac{\beta_I - \beta_{I,2}}{T_1 - T_2} T + \frac{T_1 \beta_{I,2} - T_2 \beta_I}{T_1 - T_2}\right)$$

where the constants involved in equations (24) and (25) are determined as described in stages 3.1, 3.2, 3.3 and 3.4 above.

Thus, the present invention makes possible calibration of the constants involved in the analytical expression of the mobility reduction factor of the polymer starting from simple laboratory measurements, independently defined parameter by parameter. The process according to the invention thus makes possible a reliable and flexible calibration of the model for displacement of the polymer, making possible managing the multiparameter dependencies of the model for displacement of the polymer.

4. Exploitation of the Hydrocarbons of the Formation

It is a matter, during this stage, of determining at least one plan for exploitation of the hydrocarbons present in the formation. Generally, an exploitation plan comprises a number, a geometry and a site (position and spacing) of the injection and production wells. However, a plan for exploitation of the hydrocarbons also comprises the definition of a type of enhanced recovery. In the case of an enhanced recovery of the hydrocarbons by injection of an aqueous solution comprising at least one polymer, the exploitation plan can also be defined by a type and an amount of polymer injected into the formation being studied but also in particular by the salinity, the shear rate and the temperature of the aqueous solution comprising the polymer. An optimum plan for exploitation of a reservoir of hydrocarbons must, for example, make possible a high degree of recovery of the hydrocarbons trapped in the geological reservoir, over a long exploitation time, and requiring a limited number of wells.

According to the invention, the plan for exploitation of the hydrocarbons of the formation is determined using a flow simulation making use of the model for displacement of the polymer established during the preceding stages with the simulation can be carried out by computer. An example of flow simulator (also known as reservoir simulator) which provides for a model for displacement of the polymer is the PumaFlow® software (IFP Energies nouvelles, France). According to the invention, at any instant t of the simulation, the flow simulator solves all of the flow equations specific to each mesh and delivers predicted values which are solutions of the unknowns (saturations, pressures, concentrations, temperature, and the like) at this instant t. The knowledge of the amounts of oil produced and of the state of the deposit (distribution of the pressures, saturations, and the like) at the instant considered results from this resolution. The flow simulator makes possible, by means of the model for displacement of the polymer determined on conclusion of stage 3 above, reliable prediction of the displacement performance qualities provided by the polymer under varied injection, temperature and salinity conditions.

According to one embodiment of the invention, different plans for exploitation of the fluid of the formation being studied are defined and, using the flow simulator incorporating the model for displacement of the polymer determined on conclusion of stage 3, at least one criterion, such as the amount of hydrocarbons produced according to each of the different exploitation plans, a curve representative of the simulated change in the production over time at each of the wells. The plan according to which the hydrocarbons of the deposit will actually be exploited can then correspond to that satisfying at least one of the evaluation criteria of the different exploitation plans. Advantageously, stages 1 and 2 of the process according to the invention can be applied for a plurality of polymers (that is say, polymers of different types). Starting from a model for displacement of the polymer calibrated for each of the polymers, exploitation plans are selected for each of the polymers that satisfy at least one of the predefined evaluation criteria.

Then, once the exploitation plan has been selected, the hydrocarbons trapped in the formation are exploited as a function of this exploitation plan. In particular injection of the aqueous solution comprising the polymer is performed, by drilling the injection and production wells of the exploitation plan which have been determined, to produce the hydrocarbons, and by installing the production infrastructures necessary for the development of the deposit. In particular, the type of polymer, the concentration of this polymer, the salinity, the shear rate and the temperature of the aqueous solution comprising the polymer have been predetermined by use of the process according to the invention.

It is clearly understood that the exploitation plan can evolve over the duration of an exploitation of a geological reservoir, as a function of the knowledge relating to the reservoir which is acquired during the exploitation, of the improvements in the different technical fields involved during an exploitation of a deposit of hydrocarbons (improvements in the field of drilling, of enhanced recovery, for example).

It is very clear that the process according to the invention comprises stages carried out by use of an item of equipment (for example a computer workstation) comprising data processing (a processor) and data storage (a memory, in particular a hard disk), and also an input/output interface for inputting data and returning the results of the process.

In particular, the data processing is configured in order to carry out the stage of determination of a plan for exploitation of the hydrocarbons of the formation being studied. This stage requires the use of a flow simulator implementing the model for displacement of the polymer calibrated as described in stages 1 to 3 above.

In addition, the invention relates to a computer program product which is downloadable from a communication network and/or recorded on a medium which is at least one of readable by computer and executable by a processor, comprising program code instructions for the implementation of the process as described above, when the program is executed on a computer.

Implementational Example

The characteristics and advantages of the process according to the invention will become more clearly apparent on reading the applicational example below.

More specifically, the process according to the invention is applied to a sample of a gritty rock, representative of a reservoir in which hydrocarbons are trapped. More specifically, the sample considered is provided in the form of a core with a length of 24.3 cm and with a diameter of 3.79 cm. This sample has a porosity $\varphi$ of 0.21, a permeability K=2314 mD and a rock density $\rho$=2.64 g/cm$^3$.

The polymer used is hydrolysed polyacrylamide (HPAM) referenced as Flopaam 3630S. Its molecular weight is $20 \times 10^6$ daltons. In order to carry out the experiments at different salinity, use is made of a nanofiltered seawater (subsequently denoted NF-SW) with a salinity of 10 g/l and of a synthetic seawater (subsequently denoted SSW) with a salinity of 33.55 g/l.

For this implementational example, use is made of the results of the measurements described in the document (Moradi, 2011), which are supplemented by using the exponential law described in the document (Vinogradov and Malkin, 1980) in order to extrapolate the measurements carried out for a temperature $T_1$ to a temperature $T_2$.

The process according to the invention is applied according to its fifth main alternative form described above in stage 3.5, which is targeted at determining a model for displacement of the polymer which depends on three parameters which are the salinity, the shear rate and the temperature.

The series of experiments carried out for the implementation of this fifth alternative form are summarized in Table 1: The series S1 corresponds to the implementation of stage 1 described above (compare stage 1), the series S2 corresponds to the implementation of stage 2 for the alternative form 1 (compare stage 2.1), the series S3 corresponds to the implementation of stage 2 for the alternative form 2 (compare stage 2.2) and the series S4 and S5 corresponds to the implementation of stage 2 for the alternative form 4 (compare stage 2.4).

TABLE 1

| Series | s (g/l) | $\dot{\gamma}$ (s$^{-1}$) | T (°K) | C (g/l) |
|---|---|---|---|---|
| S1 | 10.0 | 0.1 | 293.15 | {0.1, 0.25, 0.5, 0.75, 1, 1.5, 2} |
| S2 | 33.5 | 0.1 | 293.15 | {0.1, 0.25, 0.5, 0.75, 1, 1.5, 2} |
| S3 | 10.0 | 130 | 293.15 | {0.1, 0.25, 0.5, 0.75, 1, 1.5, 2} |
| S4 | 10.0 | 0.1 | 343.15 | {0.1, 0.25, 0.5, 0.75, 1, 1.5, 2} |
| S5 | 33.5 | 0.1 | 343.15 | {0.1, 0.25, 0.5, 0.75, 1, 1.5, 2} |

Dependency on the Salinity

The intrinsic viscosities $[\mu]_1$ and $[\mu]_2$ and the Huggins constants $k_1'$ and $k_2'$ are determined starting from the measurements of apparent viscosities of the series S1 and S2. The values thus determined are given in Table 2.

TABLE 2

| Intrinsic viscosity (l/g) | | Huggins constant | |
|---|---|---|---|
| $[\mu]_1$ | $[\mu]_2$ | $k_1'$ | $k_2'$ |
| 6.4 | 2.066 | 0.32 | 0.35 |

The ionic strength $I_\mu$ is then determined according to equation (6) above. The constants $b_I$ (cf. equation (7)) and $[\mu_0]$ (compare equation (8)) involved in the expression of the interpolation function $F_1(s)$ (compare equation (5)) are subsequently determined. Finally, the terms $a_I$ (compare equation (9)) and $\beta_I$ (compare equation (10)), which are involved in the expression of the Huggins coefficient according to equation (4d), are determined. The results thus obtained are summarized in Table 3.

TABLE 3

| Salinity (g/l) | | $I_\mu$(s) | | Intrinsic viscosity | | Huggins constant | |
|---|---|---|---|---|---|---|---|
| SSW | NF-SW | SSW | NF-SW | $[\mu_0]$ | $b_I$ | $\alpha_I$ | $\beta_I$ |
| 33.55 | 10.0 | 3.01 | 0.25 | 0.336 | 3 | 0.011 | 0.317 |

Dependency on the Shear Rate

In a first step, a characteristic shear rate $\dot{\gamma}_c$ with a=2.5 obtained for the granular media (as described in the document (Moradi, 2011)) is determined, i.e. $\dot{\gamma}_c$=15.08 s$^{-1}$. Then, starting from the series of experiments S3, a value of $[\mu]_3$=3.75 l/g is determined. An expression of the interpolation function $F_2(\dot{\gamma})$ according to equation (11) above is thus determined.

Dependency on the Temperature

The measurements of the series S4 are subsequently carried out and $[\mu]_4$=4.06 l/g and the Huggins constant $k'4=k'(s_1,T_2)$=0.39 are determined for the temperature $T_2$=70° C. An expression of the interpolation function $F_3(T)$ according to equation (13) above is then determined.

In addition, the series of measurements of S5 is carried out and the value of intrinsic porosity $[\mu]_5$=1.35 l/g and the Huggins constant $k'5=k'(s_2,T_2)$=0.38 are determined at the temperature $T_2$=70° C. with the salinity $s_2$=33.54 g/l.

Starting from these values, the values (cf. Table 4) of the constants $\alpha_I$, $\beta_I$, $\alpha_1$, $\alpha_2$, $\beta_1$ and $\beta_2$ (compare equations (16) to (23)) involved in the expression of the Huggins coefficient k'(s,T) according to equation (4d) are determined.

TABLE 4

| | Measurements | | | | | |
|---|---|---|---|---|---|---|
| | $\alpha_I$ | $\beta_I$ | $\alpha_1$ | $\beta_1$ | $\alpha_2$ | $\beta_2$ |
| S1 and S2 | 0.011 | 0.317 | −0.0003 | 0.099 | 0.0015 | −0.11 |
| S4 and S5 | −0.00415 | 0.39 | | | | |

Starting from the determined interpolation functions $F_1$, $F_2$ and $F_3$ above and starting from equation (3) described above, the analytical expression of the intrinsic viscosity $[\mu](s,\dot{\gamma},T)$ is determined in the form:

$$[\mu](s, \dot{\gamma}, T) = \frac{0.336 + 3 I_\mu^{-1/2}(s)}{\left[1 + \left(\frac{\dot{\gamma}}{15.08}\right)^2\right]^{0.124}} 1.57^{\left\{2011.89\left(\frac{1}{T} - \frac{1}{293.15}\right)\right\}}$$

Furthermore, the analytical expression of the Huggins coefficient is written as:

$$k'(I_\mu, T) = \left(-0.082 \frac{T}{T_0} + 0.099\right) I_\mu + \left(0.4 \frac{T}{T_0} - 0.11\right),$$

with $T_0 = 273.15°$ K.

Figure 2A:
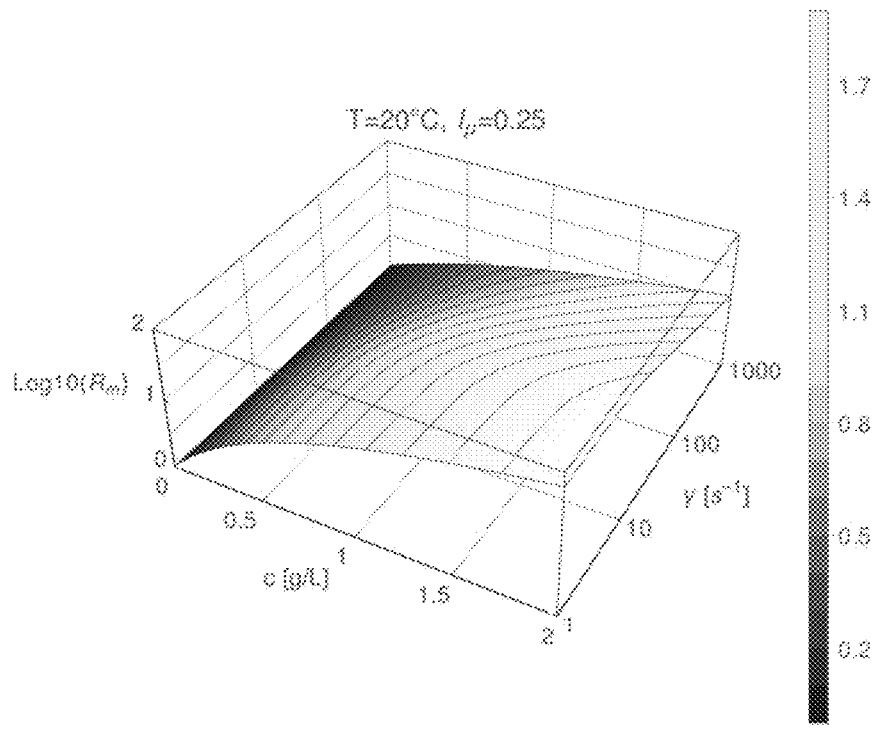
FIGS. 2A to 2E illustrate the modelling of the variations in the mobility reduction factor of the polymer obtained starting from the analytical model determined by the implementation according to the invention.
Figure 2B:
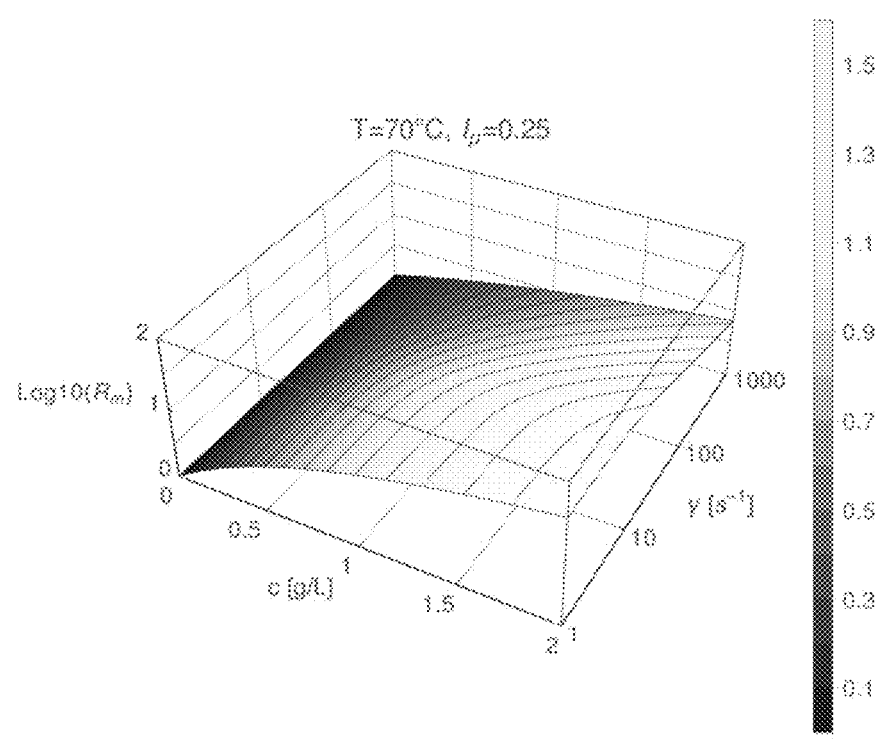
Figure 2C:
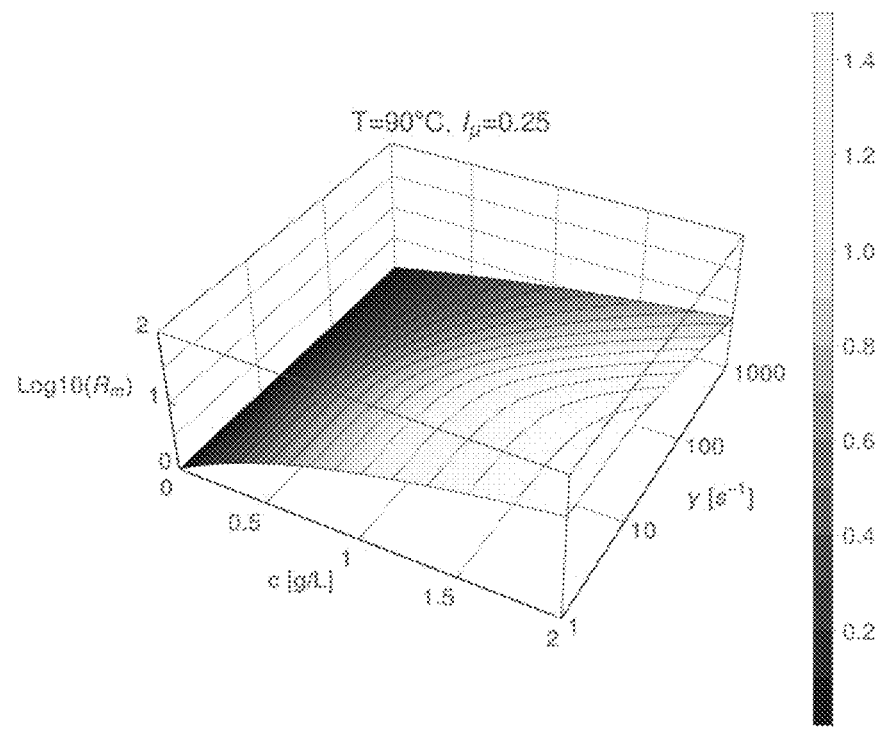
Figure 2D:
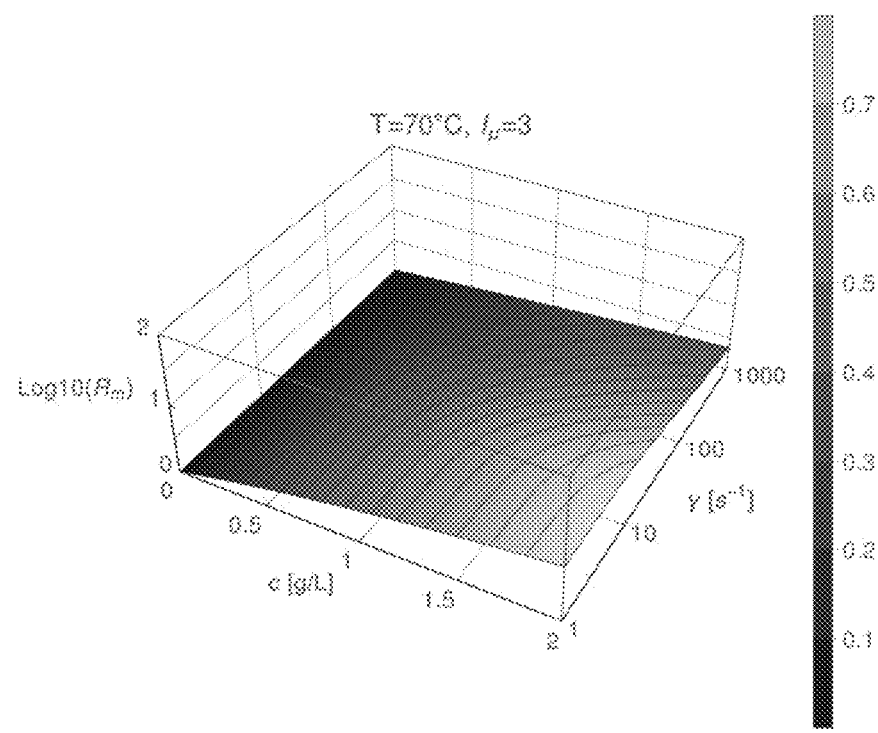
Figure 2E:
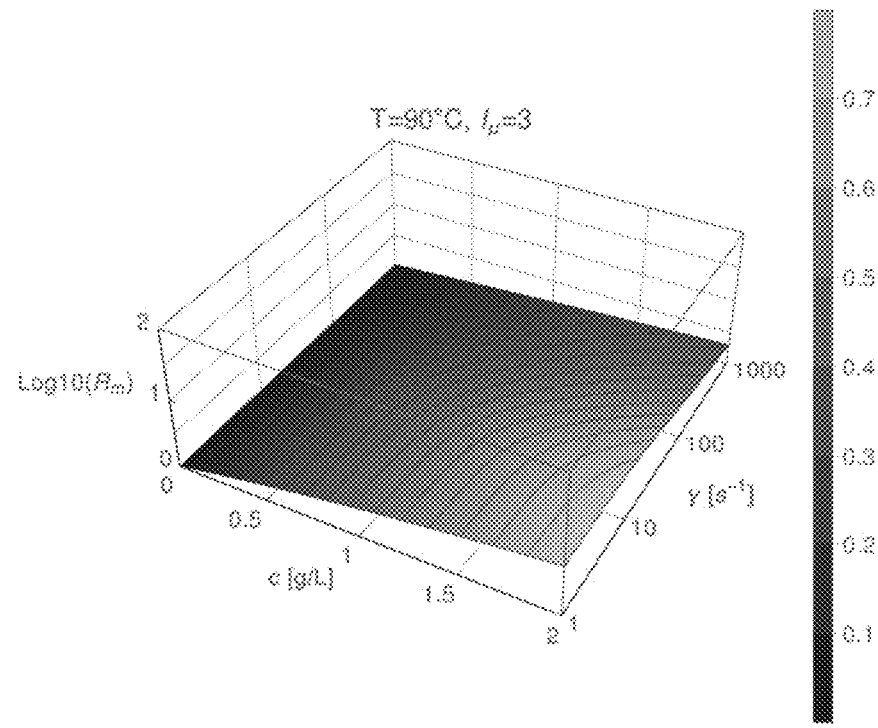

An analytical expression of the mobility reduction factor $R_m(c, s, \hat{\gamma}, T)$ is then determined according to equation (2) defined above. FIGS. 2A to 2E are presented by way of illustration of the modelling of the variations in the mobility reduction factor of the polymer which can be carried out starting from the analytical model which is determined. More specifically, FIGS. 2A to 2C exhibit the change in the mobility reduction factor determined for a salinity of 10 g/l ($I_\mu(s)$=0.25 mol/l) and for respectively a temperature T of 20° C., of 70° C. and of 90° C. FIGS. 2D and 2E exhibit the change in the mobility reduction factor determined for a salinity of 33.55 g/l ($I_\mu(s)$=3 mol/l) and for respectively a temperature T of 70° C. and of 90° C.

On comparing the values of the mobility reduction factor for different values of temperatures, it is apparent that the variations in temperature have a major impact on the reduction in the mobility and cannot be disregarded. For example, on increasing the temperature from 20° C. to 90° C., it may be observed that the mobility reduction factor can be reduced by a factor of 2. In the same way, it may be observed that the ionic strength and the concentration have a significant impact on the variations in the mobility reduction factor. For example, when the ionic strength increases from 0.25 to 3 mol/l, the mobility reduction factor decreases virtually sixfold in the most extreme case.

The analytical model of the mobility reduction factor $R_m(c, s, \hat{\gamma}, T)$ that is determined can then advantageously be implemented in reservoir simulation software, such as the PumaFlow® (IFP Energies nouvelles, France) software, in order to reliably model the flows in a reservoir and to thus determine a plan for exploitation of the hydrocarbons of the reservoir suited to the chosen polymer.

Thus, the process according to the invention makes it possible to determine a parameterization of a model for displacement of the polymer starting from experimental data not subject to the difficulties related to the multiparameter dependency of the model for displacement of the polymer. Furthermore, the process according to the invention requires a limited number of laboratory tests.

The flow simulator makes it possible, by use of the model for displacement of the polymer that is calibrated, to reliably predict the displacement performance qualities provided by the polymer under varied injection, temperature and salinity conditions.

The invention claimed is:

1. A process for exploitation of a subterranean formation comprising hydrocarbons by enhanced recovery, by use of an injection of an aqueous solution comprising at least one polymer and of a flow simulator based on a model for displacement of the at least one polymer in the formation, the model for displacement of the at least one polymer being a function of at least one concentration of at least one polymer in the aqueous solution and of at least one parameter relating to at least one characteristic of the aqueous solution comprising the at least one polymer, starting from at least one sample of the formation comprising:
  A. determining constants involved in an analytical expression of the model according to:
    a) performing apparent viscosity measurements on the at least one sample of concentrations of the at least one polymer in the aqueous solution for a first value of the parameter;
    b) determining a first value of intrinsic viscosity and a first value of a Huggins coefficient from the measurements of apparent viscosity carried out for the first value of the parameter;
    c) repeating a) for a second value of the parameter;
    d) determining at least one second value of intrinsic viscosity from the measurements of apparent viscosity carried out for the second value of the parameter; and
    e) determining, starting from the first and second values of the intrinsic viscosity and from at least the first value of the Huggins coefficient, values of the constants involved in the analytical expression of the model for displacement of the at least one polymer; and
  B. starting from the analytical expression of the displacement model and from the flow simulator, determining a plan for exploitation of the formation and using the determined plan to exploit the hydrocarbons of the formation.

2. The process according to claim 1, wherein the at least one parameter corresponds to salinity, to shear rate or to temperature of the aqueous solution comprising the at least one polymer.

3. The process according to claim 1, wherein at least one of the first value of the intrinsic viscosity and the value of the Huggins coefficient are determined by:
  determining, starting from the measurements of apparent viscosity carried out for the first or the second value of the at least one parameter, a curve representative of change in reduced specific viscosity as a function of the concentration;
  determining a tangent to the curve for lowest concentration values; and
  determining the value of the intrinsic viscosity from an ordinate at a source of at least one of the tangent and the first value of the Huggins coefficient from a slope of the tangent.

4. The process according to claim 1, wherein the model for displacement of the at least one polymer is expressed as:

$$\mu_{wp} = R_m(c, V_i) \cdot \mu_w$$

where $\mu_w$ is viscosity of an aqueous solution without polymer, $\mu_{wp}$ is viscosity of the aqueous solution comprising the at least one polymer and $R_m(c,V_i)$ is a mobility reduction factor as a function of concentration c and of parameter $V_i$, and where the mobility reduction factor is expressed according to an analytical expression:

$$R_m(c,V_i) = 1 + [\mu(V_i)]c + k'(V_i) \cdot ([\mu(V_i)]c)^2$$

where:
  $[\mu(V_i)]$ is an analytical expression of the intrinsic viscosity of the aqueous solution comprising the at least one polymer, as a function of the parameter $V_i$;
  $k'(V_i)$ is an analytical expression of the Huggins coefficient, as a function of the parameter $V_i$, the analytical expressions of the intrinsic viscosity and of the Huggins coefficient are a function of the constants.

5. The process according to claim 4, wherein the intrinsic viscosity is expressed according to a formula:

$$[\mu(V_i)] = \Pi_i F_i(V_i)$$

where $F_i$ is an interpolation function which depends at least on the parameter $V_i$.

6. The process according to claim 5, wherein the model is a function of the concentration C and of at least the parameter $V_i$ corresponding to salinity s of an aqueous solution, and in which the interpolation function $F_i$ is expressed as:

$$F_1(s) = [\mu_0] + b_1 I_\mu^{-1/2}(s)$$

where $I_\mu$ is an ionic strength of the aqueous solution, and where constants $[\mu_0]$ and b1 are determined according to a relationship:

$$b_l = \frac{[\mu]_2 - [\mu]_1}{(I_u(s_2))^{-1/2} - (I_u(s_1))^{-1/2}}$$

$$[\mu_0] = [\mu]_2 - b_l(I_u(s_2))^{-1/2}$$

where $s_1$ and $s_2$ are first and second values of the parameter $V_i$ corresponding to the salinity, and $[\mu]_1$ and $[\mu]_2$ are respectively first and second values of the intrinsic viscosity determined starting from the measurements of apparent viscosity carried out respectively for the first and second values of the parameter $V_i$ corresponding to the salinity.

7. The process according to claim 6, wherein the model is a function of the concentration C and of a single parameter $V_i$ corresponding to the salinity of the aqueous solution, and in which, in d), a second value of the Huggins coefficient is additionally determined starting from the measurements of apparent viscosity carried out for the second value of the parameter $V_i$ corresponding to the salinity, and in which the analytical expression of the Huggins coefficient is expressed as:

$$k'(s) = \alpha_I I_u(s) + \beta_I$$

where constants $\alpha_I$ and $\beta_I$ are determined according to formulae:

$$\alpha_I = \frac{k'_1 - k'_2}{I_u(s_1) - I_u(s_2)}$$

$$\beta_I = k'_2 - \alpha_I I_u(s_2)$$

where $s_1$ and $s_2$ are first and second values of the parameter $V_i$ corresponding to the salinity, $k'_1$, and $k'_2$ are respectively first and second values of the Huggins coefficient determined starting from the measurements of apparent viscosity carried out respectively for the first and second values of the parameter $V_i$ corresponding to the salinity.

8. The process according to claim 5, wherein the model is a function of the concentration C and of at least the parameter $V_i$ corresponding to a shear rate $\hat{\gamma}$ of the aqueous solution comprising the at least one polymer, and in which the interpolation function $F_i$ is written as:

$$F_2(\dot{\gamma}) = 1 \bigg/ \left[1 + \left(\frac{\dot{\gamma}}{\dot{\gamma}_c}\right)^2\right]^{\log\left(\frac{[\mu]_1}{[\mu]_2}\right)/\log\left(1+\left[\frac{\gamma_2}{\gamma_c}\right]^2\right)}$$

wherein $\gamma_c$ is a characteristic shear rate, $\gamma_2$ is a second value of the parameter $V_i$ corresponding to the shear rate, and constants $[\mu]_1$ and $[\mu]_3$ are respectively the first and second values of the intrinsic viscosity determined starting from the measurements of apparent viscosity carried out respectively for the first and second values of the parameter $V_i$ corresponding to the shear rate.

9. The process according to claim 8, wherein the model is a function of the concentration C and of a parameter $V_i$ corresponding to the shear rate of the aqueous solution, and in which the Huggins coefficient is a constant and corresponds to a first value of the Huggins coefficient determined starting from the measurements of apparent viscosity carried out for the first value of the parameter $V_i$ corresponding to the shear rate.

10. The process according to claim 5, wherein the model is a function of the concentration C and of at least the parameter $V_i$ corresponding to a temperature T of the aqueous solution comprising the at least one polymer, and in which the interpolation function is expressed as:

$$F_3(T) = \frac{[\mu]_1}{[\mu]_4}^{\frac{\left(\frac{1}{T}-\frac{1}{T_1}\right)}{\left(\frac{1}{T_1}-\frac{1}{T_2}\right)}}$$

where $T_1$ and $T_2$ are first and second values of the parameter $V_i$ corresponding to the temperature, and constants $[\mu]_1$ and $[\mu]_4$ are respectively the first and second values of the intrinsic viscosity determined starting from the measurements of apparent viscosity carried out respectively for the first and second values of the parameter $V_i$ corresponding to the temperature.

11. The process according to claim 10, wherein the model is a function of the concentration C of a single parameter $V_i$ corresponding to temperature of the aqueous solution, and in which, in d), a second value of the Huggins coefficient is additionally determined starting from the measurements of apparent viscosity carried out for the second value of the parameter $V_i$ corresponding to the temperature, and in which the analytical expression of the Huggins coefficient is expressed as:

$$k'(s) = a_T T + \beta_T$$

where constants $\alpha_T$ and $\beta_T$ are determined according to formulae:

$$\alpha_T = \frac{k'_1 - k'_4}{T_1 - T_2}$$

$$\beta_T = k'_1 - \frac{k'_1 - k'_4}{T_1 - T_2} T_1$$

where $T_1$ and $T_2$ are the first and second values of the parameter $V_i$ corresponding to the temperature, $k'_1$ and $k'_4$ are respectively first and second values of the Huggins coefficient determined starting from the measurements of apparent viscosity carried out respectively for the first and second values of the parameter $V_i$ corresponding to the temperature.

12. The process according to claim 10, in which the model is a function of the concentration C and of at least two parameters $V_i$, the two parameters $V_i$ corresponding to salinity and to the temperature of the aqueous solution, and in which:
  i) a) and b) are applied for at least one first value $s_1$ of the salinity and for at least one first value $T_1$ of the temperature;
  ii) c) and d) are applied for a second value $s_2$ of the salinity and for the first value $T_1$ of the temperature, and a value $k'_2$ of the Huggins coefficient is additionally determined; and
  iii) c) and d) are applied for a second value $T_2$ of the temperature and for the first value $s_1$ of the salinity, and a value $k_4'$ of the Huggins coefficient is additionally determined; and
  iv) measurements of apparent viscosity are carried out for a plurality of concentrations of the polymer in the aqueous solution for the second value of the salinity and the second temperature value, and a value $k'_5$ of the Huggins coefficient is determined, and in which the analytical expression of the Huggins coefficient is written according to a formula:

$$k'(I_u, T) = (\alpha_1 T + \beta_1) I_u + (\alpha_2 T + \beta_2)$$

with the constants $$\alpha_1 = \frac{\alpha_I - \alpha_{I,2}}{T_1 - T_2}, \; \alpha_2 = \frac{\beta_I - \beta_{I,2}}{T_1 - T_2}, \; \beta_1 = \frac{T_1 \alpha_{I,2} - T_2 \alpha_I}{T_1 - T_2} \text{ and}$$

$$\beta_2 = \frac{T_1 \beta_{I,2} - T_2 \beta_I}{T_1 - T_2} \text{ and } \alpha_I = \frac{k'_2 - k'_1}{s_2 - s_1}, \alpha_{I,2} = \frac{k'_5 - k'_4}{s_2 - s_1},$$

$$\beta_I = k'_1 - \frac{k'_2 - k'_1}{s_2 - s_1} s_1 \text{ and } \beta_{I,2} = k'_4 - \frac{k'_5 - k'_4}{s_2 - s_1} s_1,$$

where $k_1'$ is a first value of the Huggins coefficient determined starting from the measurements of apparent viscosity carried out during a).

13. The process according to claim 1, in which, by use of the flow simulator incorporating the analytical expression of the model for displacement of the polymer, an evaluation is carried out for exploitation plans according to at least one predefined criterion, and the hydrocarbons of the formation are exploited according to the plan satisfying the criterion.

14. The process according to claim 1, in which the hydrocarbons of the formation are exploited by injecting the aqueous solution comprising the polymer, by drilling at least one injection well and at least one production well of the exploitation plan, and by installing production infrastructures suited to development of the deposit.

\* \* \* \* \*